United States Patent [19]
Katada et al.

[11] Patent Number: 5,383,993
[45] Date of Patent: Jan. 24, 1995

[54] METHOD OF BONDING SEMICONDUCTOR SUBSTRATES

[75] Inventors: Mitsutaka Katada, Kariya; Kazuhiro Tsuruta, Oobu; Seiji Fujino, Toyota; Michitoshi Onoda, Toyohashi, all of Japan

[73] Assignee: Nippon Soken Inc., Nishio, Japan

[21] Appl. No.: 118,784

[22] Filed: Sep. 10, 1993

Related U.S. Application Data

[63] Continuation of Ser. No. 675,613, Mar. 27, 1991, abandoned.

[51] Int. Cl.⁶ ............. H01L 21/20; H01L 21/02
[52] U.S. Cl. .................. 156/153; 156/273.9; 156/281; 437/921; 437/974; 437/225; 148/DIG. 12; 148/DIG. 159; 148/DIG. 135
[58] Field of Search ........... 156/153, 273.9, 281; 437/921, 974, 225; 148/DIG. 12, DIG. 159, DIG. 135

[56] References Cited

U.S. PATENT DOCUMENTS

| | | | |
|---|---|---|---|
| 3,506,424 | 4/1970 | Pomerantz | 148/DIG. 12 |
| 4,501,060 | 2/1985 | Frye et al. | 156/273.9 X |
| 4,774,196 | 9/1988 | Blanchard | 148/DIG. 135 X |
| 4,810,318 | 3/1989 | Haisma et al. | 156/153 |
| 4,944,754 | 7/1990 | Linkow et al. | 204/298.04 X |
| 4,983,251 | 1/1991 | Haisma et al. | 437/974 X |
| 5,169,472 | 12/1992 | Goebel | 156/153 X |

FOREIGN PATENT DOCUMENTS

| | | | |
|---|---|---|---|
| 62-122148 | 6/1987 | Japan | 148/DIG. 12 |
| 1226168 | 9/1989 | Japan | 437/974 |

OTHER PUBLICATIONS

Lasky, J. B., "Wafer Bonding for Silicon-on-Insulator Technologies", Appl. Phys. Lett. 48(1), 6 Jan. 1986, pp. 78–80.

*Primary Examiner*—Jeff H. Aftergut
*Attorney, Agent, or Firm*—Cushman, Darby & Cushman

[57] ABSTRACT

In a method of bonding semiconductor substrates, a plurality of the semiconductor substrates are first prepared. Surfaces of the semiconductor substrates are mirror-polished. The mirror-polished surface of at least one of the semiconductor substrates is then provided with a hydrophilic property in such a way that an oxide layer is formed on the mirror-polished surface by exposing the mirror-polished surface to an atmosphere of at least one of an oxygen ion and an oxygen radical. A water molecule is then adhered to the mirror-polished surface. The semiconductor substrates then contact with each other through the mirror-polished surface. The contacted semiconductor substrates are then heated. According to such a method of bonding, the semiconductor substrates are strongly bonded to each other with hardly an unbonded region even if the semiconductor substrates are heated at a low temperature.

21 Claims, 9 Drawing Sheets

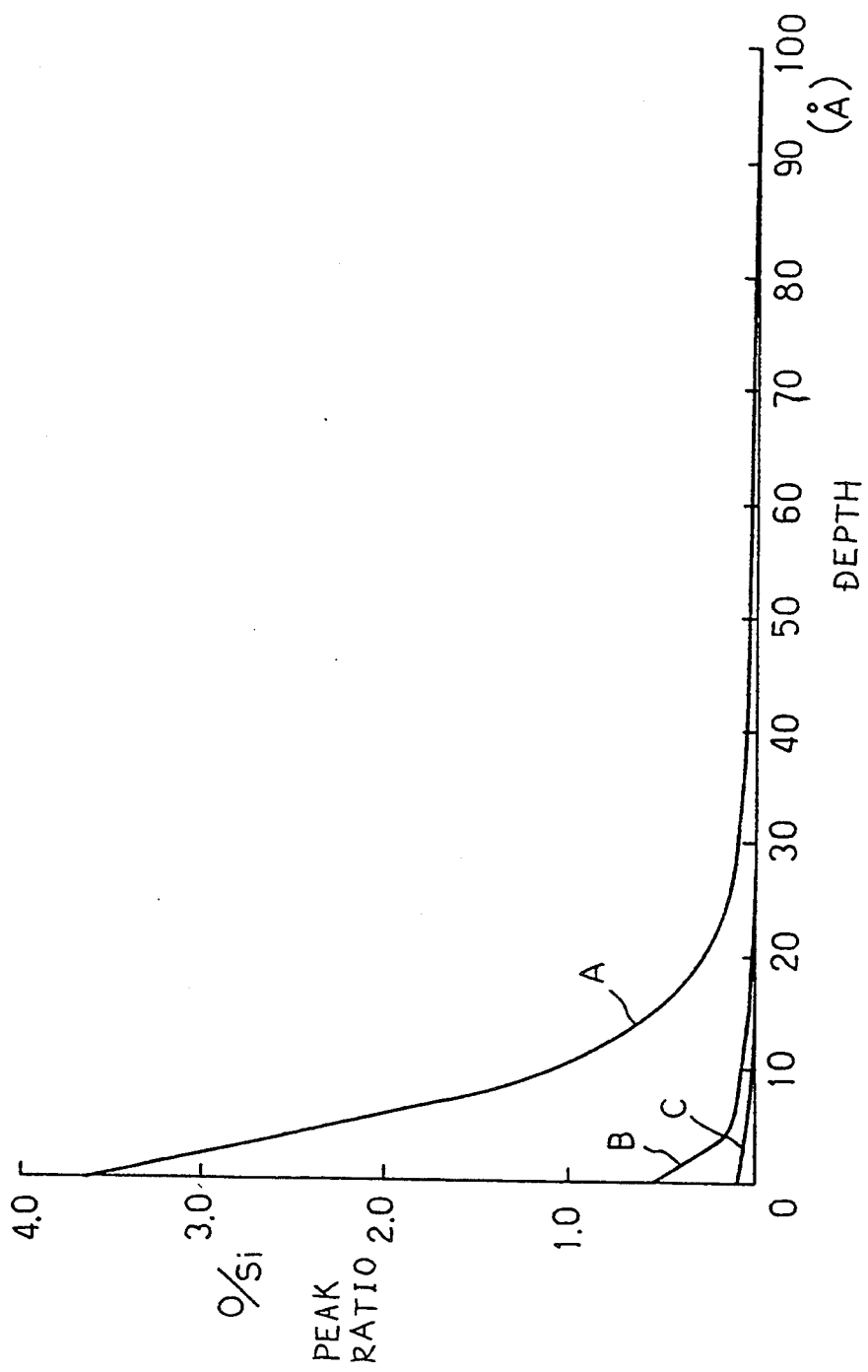

(PRIOR ART)

METHOD OF BONDING SEMICONDUCTOR SUBSTRATES

This is a continuation of application No. 07/675,613, filed on Mar. 27, 1991, now abandoned.

BACKGROUND OF THE INVENTION

1. Field of the Invention

The present invention relates to a method of bonding semiconductor substrates without using an adhesive agent.

2. Description of the Related Art

A wafer direct bonding method has been known as a method of bonding silicon substrates. This method can get rid of a bad influence of thermal strain because an intermediate layer, such as an adhesive agent, does not exist at a bonding interface. Such a method is described in U.S. Pat. No. 4,671,846.

This wafer direct bonding method will be described with reference to FIGS. 7(a)-(c).

Natural oxide layers which are formed on surfaces of mirror-polished silicon wafers, are removed by HF(hydrogen fluoride) to expose silicon atoms on the surfaces. Thereafter, the surfaces are then provided with a hydrophilic property. Namely, silanol groups (Si—OH) are formed on the wafer surfaces by immersing the wafers in an acid solution, such as a mixture of $H_2SO_4$ and $H_2O_2$, the temperature of which is 90° C. As shown in FIG. 7(a), the surfaces then contact to each other. In this situation, hydroxyl groups which are formed on the surfaces hydrogen-bond. As shown in FIG. 7(b), the wafers are then heated at more than 800° C. in $N_2$ atmosphere or $O_2$ atmosphere to strongly bond the two wafers between which Si—O—Si structure is formed. In this case, when the temperature of the heat treatment is more than 1000° C., as shown in FIG. 7(c), Si—Si structure is formed between the two wafers because O(Oxygen) atoms diffuse in the wafers.

According to the above-mentioned method, only Si(silicon), O and H(hydrogen) exist at the bonding interface. Therefore, the bonding interface is chemically stable without corrosion or the like. Moreover, when this bonding method is applied the bonding between a sensing portion of a sensor and a stage, it is possible to use the same material of the sensing portion as the material of the stage. Consequently, it is possible to get rid of the problem, such as temperature drift, which is caused by the strain which occurs in accordance with the variation of temperature because it is possible to coincide the thermal expansion coefficient of the sensing portion with that of the stage.

U.S. Pat. No. 4,671,846 says that, when the wafers are heated at more than 300° C., the wafers bond to each other. However, to uniformly bond the whole surfaces of, for example, 3 inches-wafers, the wafers need to be heated at more than 800° C. The reason why is that, when the wafers are heated at the relative low temperature of less than 800° C., many unbonded regions are formed. The unbonded regions are caused by desorption of molecule, such as $H_2$ or $H_2O$, which occurs by dehydration condensation reaction.

For example, when the above-mentioned bonding method is applied to the bond between a sensing portion of a pressure sensor and a stage, the sensor can not withstand high pressure because it is easy to come the sensing portion off the stage owing to the unbonded regions. Moreover, the characteristic of the sensor changes because unwanted stress acts on the sensing portion.

Conventionally, a sensing portion of a pressure sensor and a stage are bonded to each other by anodic bonding method. According to this method, the fracture strength between the sensing portion and the stage is about 1 Kgf/mm². In the above-mentioned wafer direct bonding method, the wafers need to be heated at more than 1100° C. so as to make the fracture strength more than 1 Kgf/mm².

Moreover, as mentioned above, the wafers need to be immersed in the acid solution to form the silanol groups on the surfaces. Therefore, when this process is carried out after an element is formed on the wafer, the surface to form the element therein needs to be covered with an acid-resisting passivation film to prevent a wiring, made of Al(aluminum), Au(gold) or the like, from corroding away. Consequently, the number of processes increases. The temperature of heat treatment which can be carried out to the wafer having the wiring is at most 450° C. Therefore, it is impossible to get the fracture strength of more than 1 Kgf/mm².

SUMMARY OF THE INVENTION

An object of the present invention is to provide a method of bonding semiconductor substrates which strongly bond to each other with hardly forming the unbonded region even if the substrates are heated at lower temperature than the temperature of the heat treatment carried out in the prior art.

Another object of the present invention is to provide a method of bonding semiconductor substrates, one of the substrates bonding to the other without damage of an element, such as an Al wiring, formed on the surface of the one substrates.

To accomplish the above objects, in a method of bonding semiconductor substrates according to the present invention, a plurality of the semiconductor substrates are first prepared. Surfaces of the semiconductor substrates are mirror-polished. The mirror-polished surface of at least one of the semiconductor substrates is then provided with a hydrophilic property in such a way that an oxide layer is formed on the mirror-polished surface by exposing the mirror-polished surface to an atmosphere of at least one of an oxygen ion and an oxygen radical. A water molecule is then adhered to the mirror-polished surface. The semiconductor substrates then contact with each other through the mirror-polished surface. The contacted semiconductor substrates are then heated.

When the mirror-polished surface reacts with the oxygen ion or the oxygen radical, an oxygen concentration of the mirror-polished surface is high, and the thickness of the oxide layer is thicker than the oxide layer formed by the conventional method.

Therefore, the number of silanol groups per unit area becomes large, and the power of hydrogen bond becomes stronger than that of the prior art owing to this oxide layer.

Moreover, because the density of the hydrogen bond is high, and the distance between bonded surfaces of the two semiconductor substrates is short, atoms can easily move between the semiconductor substrates. Because the hydrogen bond changes into covalent bond having Si—O—Si structure at a relative low temperature, the semiconductor substrates are strongly bonded to each other even if the semiconductor substrates are heated at a lower temperature than a temperature of the prior art.

BRIEF DESCRIPTION OF THE DRAWINGS

FIG. 5 is the distribution map, in a depth direction, of the ratio of the peak of O-concentration to that of Si-concentration measured by XPS(X-ray photoelectron spectroscopy) method;

DETAILED DESCRIPTION OF THE EMBODIMENTS

The present invention will be described below with reference to embodiments shown in the accompanying drawings.

First Embodiment

Figure 1A:
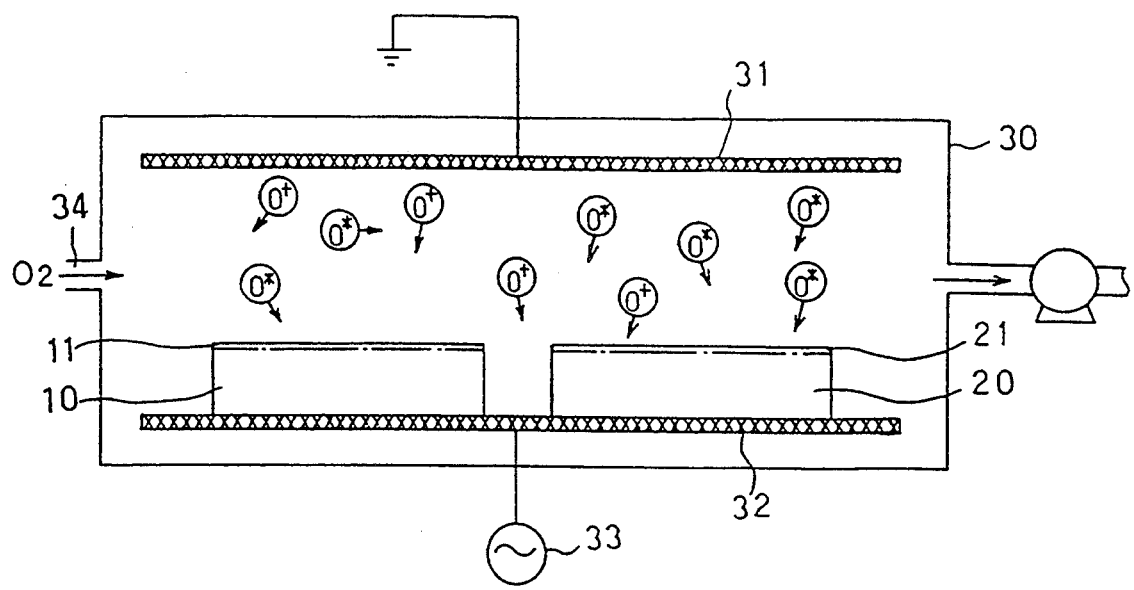
FIGS. 1(a) to 1(c) are schematic diagrams for explaining manufacturing steps of a first embodiment of the present invention.
Figure 1B:
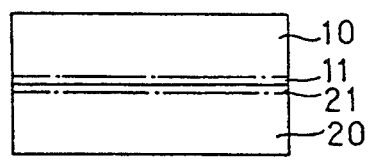
Figure 1C:
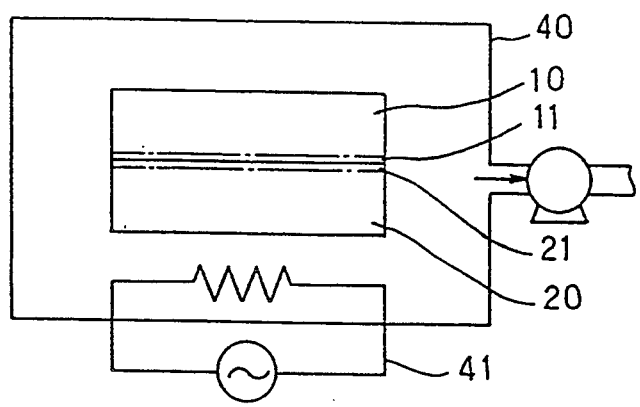

FIGS. 1(a) to 1(c) are process drawings of a first embodiment of the present invention.

A first semiconductor substrate 10 and a second semiconductor substrate 20 are prepared, at least respective one of surfaces of these substrates 10 and 20 being mirror-polished. It is noted that it is desirable that the surface roughness of the mirror-polished surface is more fine. For example, the surface roughness Ra of a wafer which is purchased from a wafer maker is less than 5 nm. Such surface roughness is sufficiently fine. The first semiconductor substrate 10 and the second semiconductor substrate 20 are, for example, boiled with trychloroethylene, ultrasonic-cleaned with acetone, and washed with pure water in order. Natural oxide layers formed on each of the surfaces are removed by the mixture in which the ratio of HF(hydrogen fluoride) to $H_2O$ is 1:50.

As shown in FIG. 1(a), these two substrates 10 and 20 are put in a vacuum system 30. Attainable vacuum degree of the vacuum system 30 is less than 1 Pa. The vacuum system 30 has an electrode 31 and an electrode 32 therein. The electrode 31 is grounded, and the electrode 32 is electrically connected with an RF(radio frequency) power supply 33. When gas is introduced in the vacuum system 30 through a gas introducing pipe 34, a plasma of the gas occurs between the electrode 31 and the electrode 32. The substrate 10 and the substrate 20 are put on the electrode 32, that is, these substrates 10 and 20 are so-called cathode-coupled. The mirror-polished surfaces of the substrate 10 and the substrate 20 are opposite to the electrode 31.

In this situation, the vacuum system 30 vacuums until vacuum degree is less than 1 Pa. $O_2$ gas is then introduced in the vacuum system 30 through the gas introducing pipe 34. Discharge is occurred between the electrode 31 and the electrode 32 by electric power of the RF power supply 33 to generate Oxygen plasma. During this discharge, the pressure of the gas is in a range of 1–25 Pa, and the power of discharge is in a range of 100–800 W/m$^2$. After these processes, plasma oxide layer 11 and 21 are respectively formed on the surfaces of the substrate 10 and the substrate 20, the surfaces having been exposed to the oxygen plasma.

It is noted that the oxygen plasma includes an oxide radical (shown by a symbol "O*") and an oxide ion (shown by a symbol "O+"). This is a positive oxygen ion. The oxide radical and the oxide ion are chemically active. Therefore, it is easy to oxidize even at normal temperatures. The oxide ion easily reaches on the substrate 10 and the substrate 20 because, as mentioned above, these substrates 10 and 20 are cathode-coupled. Therefore, it is easy to quicken the reaction of oxidation by this reason as well as the above-mentioned reason. Moreover, because the surface facing to the region in which the oxygen plasma occur is only respective one surface of each of the substrates 10 and 20, the other surface is not damaged by the oxygen plasma. Furthermore, because the oxidation is carried out at normal temperature, even if an element is formed on the other surface, the characteristic of the element is not deteriorated. Thus, the plasma oxide layers 11 and 21 are formed on the substrates 10 and the substrate 20 respectively.

The substrate 10 and the substrate 20 are washed with pure water, and dried by dry nitrogen so as to control the quantity of water adhering the surfaces of the substrate 10 and the substrate 20. As shown in FIG. 1(b), the surface on which the plasma oxide layer 11 is formed is contacted with the surface on which the plasma oxide layer 21 is formed, whereby the substrate 10 and the substrate 20 bond to each other through hydrogen bond of silanol groups formed on the surfaces of the substrates 10 and 20 and water molecules adhered to the surfaces. This contacting process is carried out in a clean room. The bonded substrates 10 and 20 are dried in the vacuum of less than 10 Torr. At this time, a load of more than 30 gf/cm$^2$ may be put on the substrate 10 and 20 to compensate for the warp of the substrates 10 and 20.

As shown in FIG. 1(c), the bonded substrates 10 and 20 are then put in a vacuum system 40. Attainable vacuum degree of the vacuum system 30 is less than 10 Torr. While the excessive water molecules existing at a bonding interface is taken out, the bonded substrates 10 and 20 are heated at the temperature of 200°–600° C. by a heater 41 to more strongly bond the bonded substrates 10 and 20.

FIG. 5 shows the distribution map, in a depth direction, of the ratio of the peak of O(oxygen)-concentration to that of Si-concentration measured by XPS method. In FIG. 5, line A shows the distribution of the surface on which the plasma oxide layer is formed by the Oxygen plasma process explained by utilizing FIG. 1(a) according to the present embodiment, line B shows the distribution of the surface provided with a hydrophilic property by the oxidation utilizing an acid solution (a mixture of $H_2SO_4$ and $H_2O_2$) according to the prior art, and line C shows the distribution of the surface from which the natural oxide layer is removed by the HF solution, the surface not being provided with the hydrophilic property yet. As shown FIG. 5, the substrate having the surface on which the plasma oxide layer is formed has plenty of oxygen, and the oxygen deeply diffuses in the substrate. In the prior art, the depth of the oxygen is at most 15Å. According to the present embodiment, the number of the silanol groups per unit area is large, and the power of the hydrogen bond is stronger than that of the prior art in the process shown in FIG. 1(b). Furthermore, the density of the hydrogen bond at the bonding interface between the substrate 10 and the substrate 20 is high. Because the distance between the substrate 10 and the substrate 20 is short, atoms can easily move between the two substrates 10 and 20. Consequently, in the process shown in FIG. 1(c), because the hydrogen bond changes into covalent bond having Si—O—Si structure at a relative low temperature, the unbonded region which is caused by the desorption of the water molecule hardly occur at the bonding interface. Therefore, the substrate 10 and the substrate 20 are strongly bonded by the heat treatment of lower temperature than the temperature of the prior art.

Figure 8:
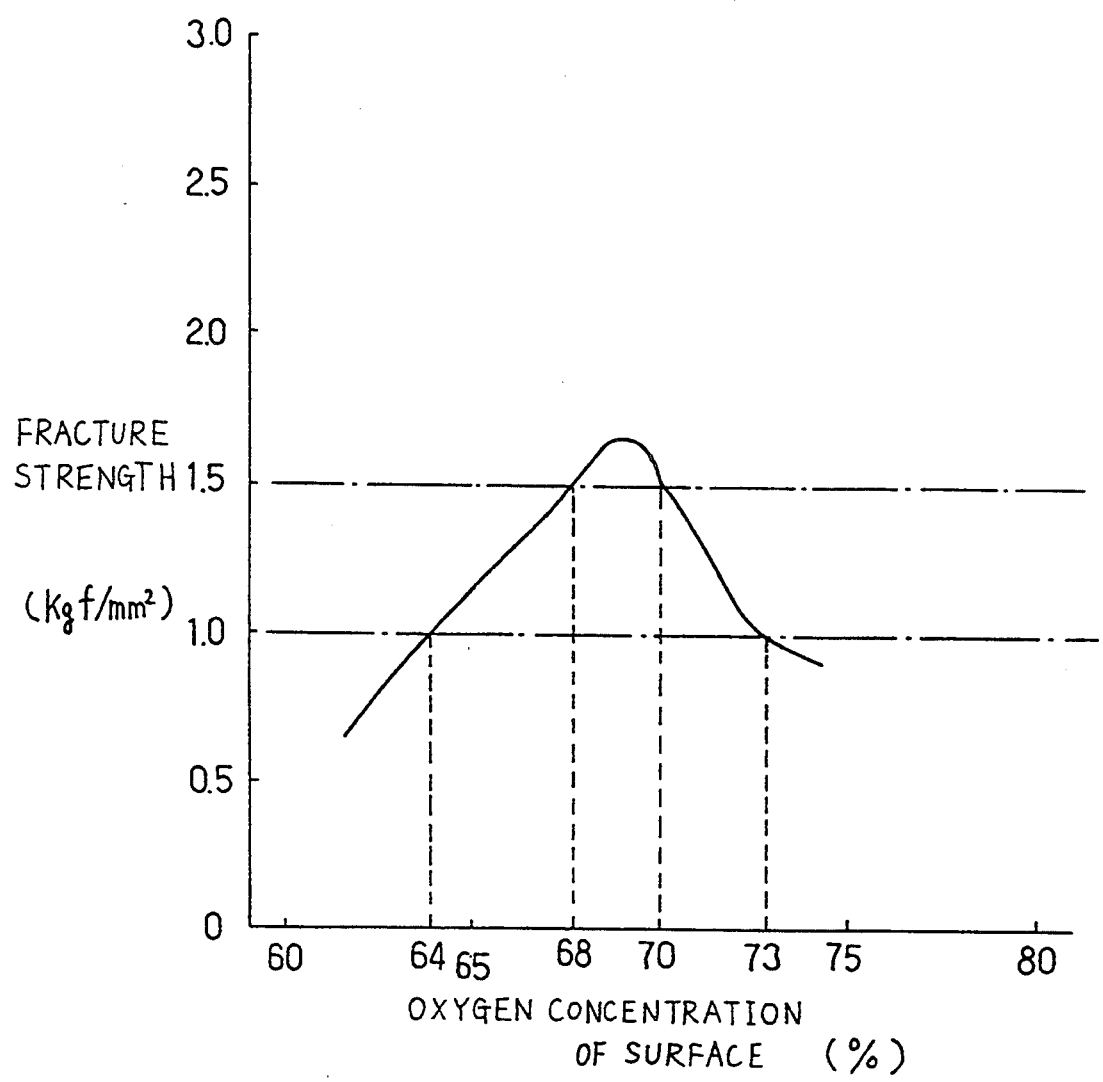
FIG. 8 shows the relationship between an oxygen concentration of a surface and the fracture strength.

FIG. 8 shows the relationship between the oxygen concentration of the surface and the fracture strength. The temperature of the heat treatment was 450° C. when the substrate 10 and the substrate 20 are heated by the heater 41. As shown in FIG. 8, when the oxygen concentration is in a range of 64–73%, the fracture strength is more than 1 Kgf/mm$^2$. When the oxygen concentration is in a range of 68–70%, the fracture strength is more than 1.5 Kgf/mm$^2$, such fracture strength corresponding to the strength of a silicon substrate having no bonding interface.

Figure 9:
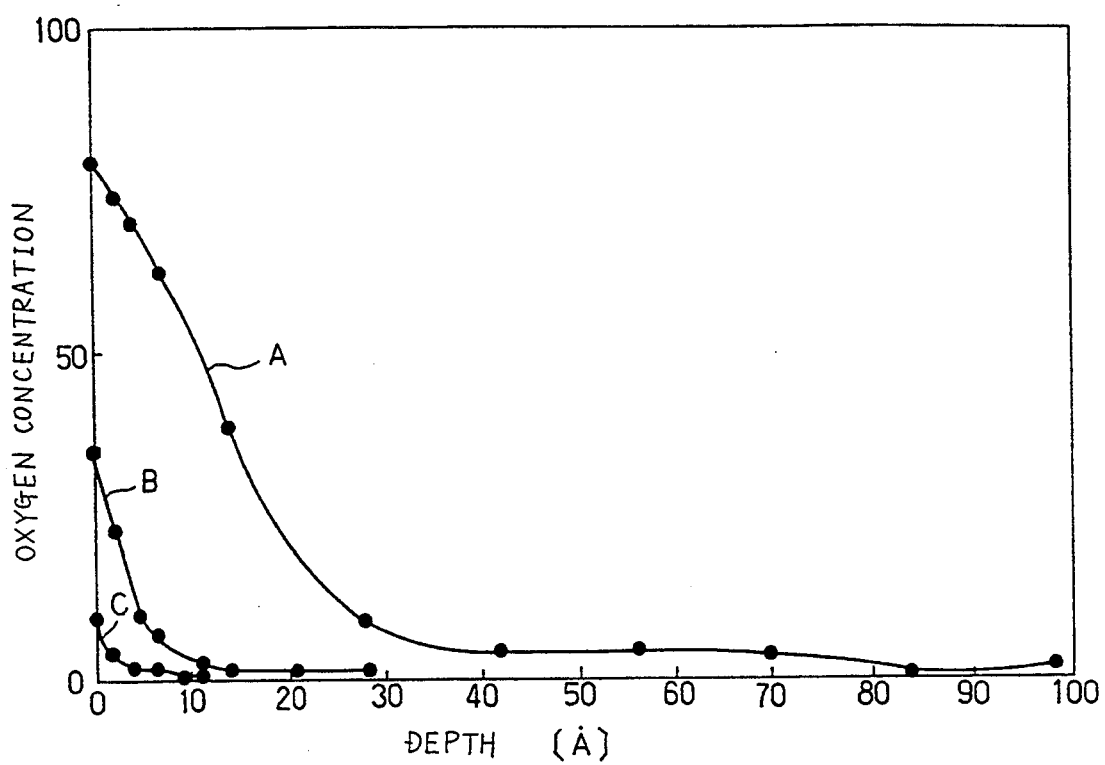
FIG. 9 is the distribution map, in a depth direction, of the oxygen concentration is a silicon, the concentration being measured by the XPS method.

FIG. 9 shows the distribution map, in a depth direction, of the oxygen concentration. In FIG. 9, line A shows the distribution of the surface on which the plasma oxide layer is formed by the oxygen plasma process according to the present embodiment, line B shows I the distribution of the surface provided with a hydrophilic property by the oxidation utilizing an acid solution according to the prior art, and line C shows the distribution of the surface which is not provided with the hydrophilic property yet. The oxygen concentration of the present embodiment is higher than that of the others.

It is noted that, in the above-mentioned first embodiment, the two plasma oxide layers 11 and 21 are formed on the substrate 10 and the substrate 20 respectively, but one of the plasma oxide layers 11 and 21 have only to be formed.

Second Embodiment

In the second embodiment, the first semiconductor substrate 10 is provided with the hydrophilic property by the Oxygen plasma process like the first embodiment, and the second semiconductor substrate 20 is provided with the hydrophilic property by the oxidation utilizing the acid solution (the mixture of $H_2SO_4$ and $H_2O_2$) like the prior art.

Figure 2A:
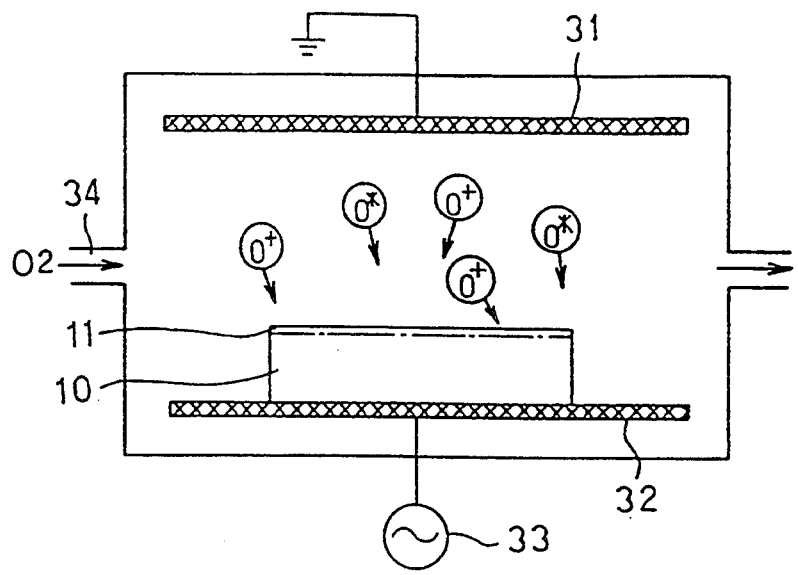
FIGS. 2(a) to 2(c) are schematic diagrams for explaining manufacturing steps of a second embodiment of the present invention.
Figure 2B:
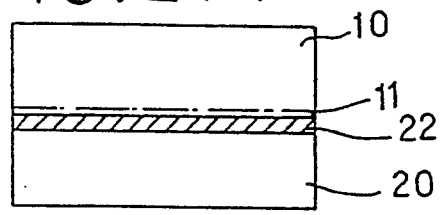
Figure 2C:
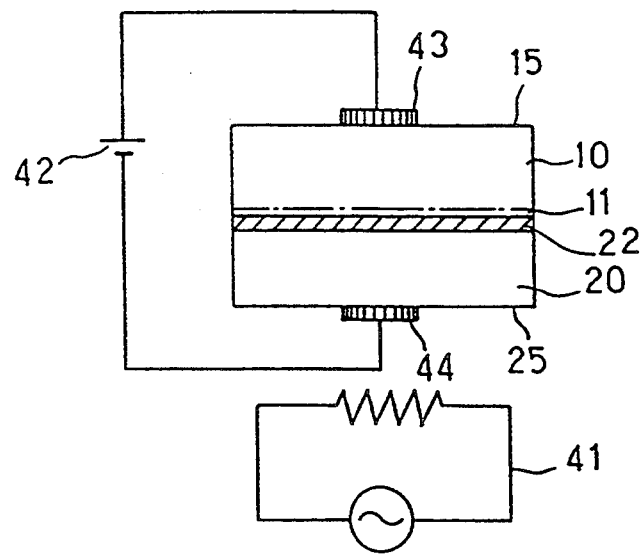

FIGS. 2(a)–2(c) are process drawings of the second embodiment of the present invention.

As shown in FIG. 2(a), the plasma oxide layer 11 is formed on the mirror-polished surface of the substrate 10 by the Oxygen plasma process which is the same process as the process shown in FIG. 1(a). On the other hand, an oxide layer 22 having a thickness of 1 μm is formed on the mirror-polished surface of the substrate 20 by well-known method, such as thermal oxidation, CVD(Chemical Vapor Deposition), sputtering, evaporation or the like. The substrate 20 is then immersed in the mixture of $H_2SO_4$ and $H_2O_2$ so as to chemically activate (not shown), the temperature of the mixture being more than 80° C.

The substrate 10 and the substrate 20 are then washed in pure water, and dried by dry nitrogen so as to control the quantity of water adhering the surfaces of the substrate 10 and the substrate 20. As shown in FIG. 2(b), the surface on which the plasma oxide Layer 11 is formed is contacted with the surface on which the oxide layer 22 is formed in the same process as the process shown in FIG. 1(b).

As shown in FIG. 2(c), both surfaces of the contracted substrates 10 and 20, that is, an upper surface 15 and a lower surface 25 are then respectively connected with an electrode 43 and an electrode 44. While an electric voltage is supplied to the contacted substrates 10 and 20 through the electrodes 43 and 44 by a direct-current power supply 42, the contacted substrates 10 and 20 are heated at the temperature of 200°–600° C. by the heater 41 for more than an hour. During this heat treatment, supplied electric field is 1–5 MV/cm, and the electric voltage supplied between the substrates 10 and 20 is 100–500 V. According to this process, the coulomb power of an electro static field uniformly generates between the substrate 10 and the substrate 20, whereby the warp of a micro region of the substrates 10 and 20 is compensated, such warp not being compensated by only the load. Therefore, the substrate 10 and the substrate 20 are uniformly bonded to each other.

According to the present invention, the unbonded region which is caused by the desorption of the water molecule hardly occur at the bonding interface like the above-mentioned first embodiment even if the substrates 10 and 20 are heated at the relative low temperature of less than 600° C. Therefore, the two substrates 10 and 20 are strongly bonded to each other.

Figure 6:
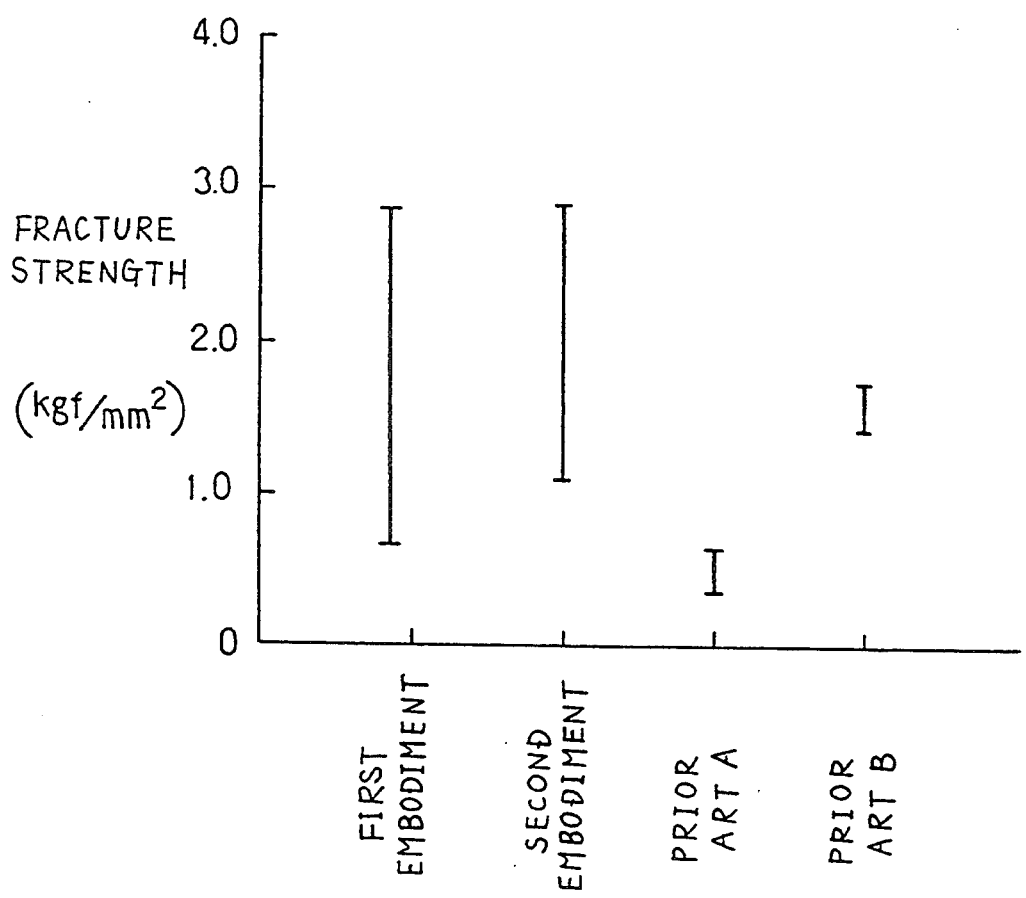
FIG. 6 shows the fracture strength of bonded substrates.
Figure 7A:
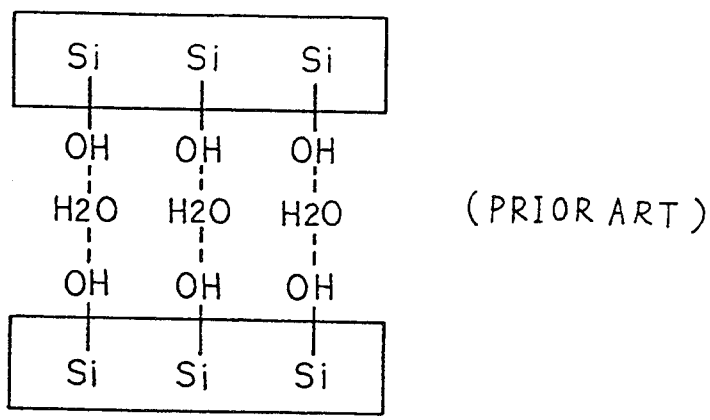
FIGS. 7(a)–7(c) are schematic diagrams for explaining a method of the prior art.
Figure 7B:
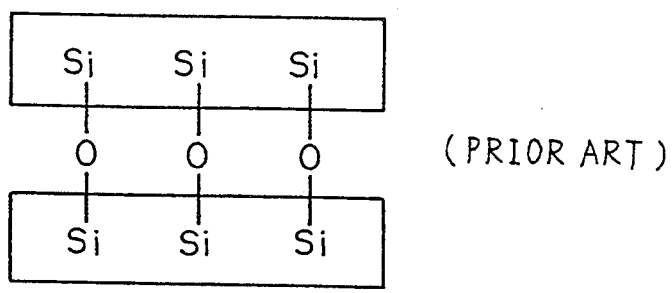
Figure 7C:
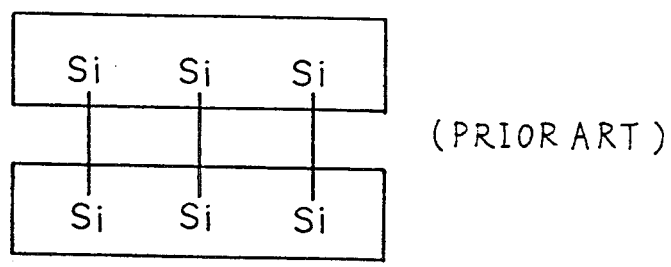

FIG. 6 shows the fracture strength of bonded substrates of the first and second embodiments. The bonded substrates were heated at 450° C. for two hours in the both embodiments.

FIG. 6 shows also the fracture strength of bonded substrates of a prior art A and a prior art B, the substrates being provided with the hydrophilic property by the oxidation utilizing the mixture of $H_2SO_4$ and $H_2O_2$. In the prior art A, the bonded substrates were heated at 450° C. for two hours. In the prior art B, the bonded substrates were heated at 1100° C. for an hour.

As shown in FIG. 6, in the bonded substrates of the prior art, the bonded substrates must be heated at more than approximately 1000° C. to get the fracture strength of more than 1 Kgf/mm$^2$. On the contrary, in the first and second embodiment, the bonded substrates have only to be heated at 450° C. for two hours to get the fracture strength of more than 1 Kgf/mm$^2$. Especially, in the second embodiment, it is easy to get the fracture strength of more than 1 Kgf/mm$^2$. It is noted that the heat treatment at 450° C. for two hours is the heat load which corresponds to the sintering process for the electrode formed on a surface of a substrate in a conventional semiconductor device manufacturing process. According to the first and second embodiment, as mentioned above, the processes carried out to the substrate 10 are only the process with chemicals of organic solvent, pure water, and dilute solution of hydrogen fluoride and the oxygen plasma process which is carried out to the bonding surface of the substrate 10 at normal temperature. Therefore, even if the substrate 10 and the substrate 20 are bonded to each other after a semiconductor element is formed in an unbonded surface of the substrate 10, the element is not exerted a bad influence, such as a change of a diffusion shape of impurities thereof, damage of an electrode, a change or deteriorate of the characteristic thereof. Consequently, it is unnecessary to increase the number of processes for forming, for example, the acid-resisting passivation film, and it is easy to bond the two substrates 10 and 20.

Although the bonded surface of the substrate 10 to which the oxygen plasma process is carried out is a silicon surface which exposes silicon atoms to the oxygen plasma, the bonded surface may be a $SiO_2$ (silicon oxide) surface of a $SiO_2$ layer formed on the substrate 10 by thermal oxidation, CVD, sputtering or evaporation. Here, when the semiconductor element having an Al wiring has been formed in the substrate 10, the thermal oxidation can not be carried out at more than 450° C. because, as mentioned above, the temperature of heat treatment which can be carried out to the substrate 10 having the Al wiring is at most 450° C.

Table 1 shows the combination of material of the bonded surface of the first semiconductor substrate and the second semiconductor substrate and the process for providing with the hydrophilic property. According to these combinations, it is possible to get the same effect as the effect of the first and second embodiments. The element having Al wiring or the like has already been formed in the first semiconductor substrate.

TABLE 1

| Bonded Surface | Si | Si | $SiO_2$ | $SiO_2$ |
|---|---|---|---|---|
| First Semiconductor Substrate | | | | |
| Process | Oxygen Plasma Process | Oxygen Plasma Process | Oxygen Plasma Process | Oxygen Plasma Process |
| Second Semiconductor Substrate | | | | |
| Process | Oxygen Plasma Process or Immersing in Acid Solution | Oxygen Plasma Process or Immersing in Acid Solution | Oxygen Plasma Process or Immersing in Acid Solution | Oxygen Plasma Process or Immersing in Acid Solution |

The oxide layer is formed in such a way that the substrate which is cathode-coupled is exposed to the oxide ion and the oxide radical generated by discharge in the above-mentioned embodiments. The oxide layer may be formed by electron cyclotron resonance method, ion implanting method or the like in place of the above-mentioned method.

A semiconductor pressure sensor manufactured by the present invention will be described with reference to FIGS. 3(a) and 3(b).

Figure 3A:
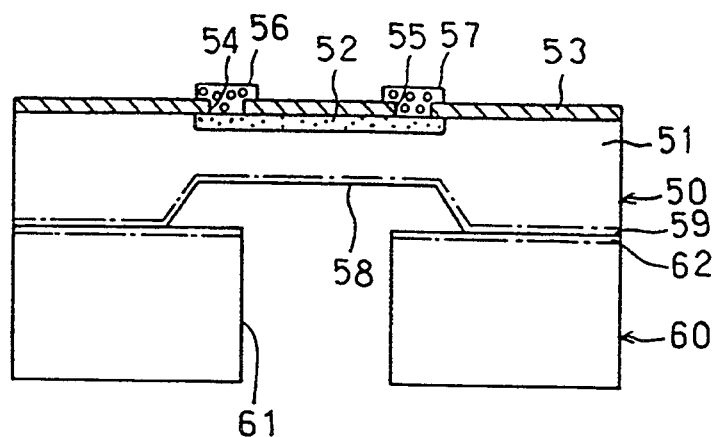
FIG. 3(a) is a cross-sectional view of a semiconductor pressure sensor manufactured by applying the first embodiment.

FIG. 3(a) shows a construction view of the semiconductor pressure sensor manufactured by the method of bonding of the above-mentioned first embodiment. As shown in FIG. 3(a), the pressure sensor has a sensing portion 50 and a stage 60. In the sensing portion 50, a P-type diffusion layer 52 is formed in a first surface of an N-type semiconductor substrate 51 as a diffused strain gauge. A passivation film 53 is also formed on the first surface. Contact holes 54 and 55 are formed in the passivation film 53 to contact with the P-type diffusion layer 52. Electrodes 56 and 57 contacts with the P-type diffusion layer 52 through the contact holes 54 and 55. A diaphragm 58 is formed in such a way that a second surface of the N-type semiconductor substrate 51 which is opposite to the second surface is etched by a well-known process, such as anisotropic etching utilizing an alkalide solution, or isotropic etching utilizing a mixture of HF, $HNO_3$ and $CH_3COOH$. The stage 60 is made of the same material as the material of the sensing portion 50. A pressure introducing port 61 is formed in the stage 60.

A semiconductor substrate which will be the sensing portion 50 is regarded as the above-mentioned first semiconductor substrate. A semiconductor substrate which will be the stage 60 is regarded as the above-mentioned second semiconductor substrate. These substrates have already had the above-mentioned elements, or have already been processed by the above-mentioned processes. The second surface of the first semiconductor substrate and one surface of the second semiconductor substrate are mirror-polished. Then, plasma oxide layers 59 and 62 are formed on the surfaces of these mirror-polished first and second semiconductor substrate respectively. The diaphragm 58 is aligned with the pressure introducing port 61. The first and second semiconductor substrate are then bonded to each other. It is noted that these processes are carried out by following the processes explained with reference to FIGS. 1(a)-1(c).

According to the pressure sensor, the sensing portion 50 and the stage 60 are made of the same material, and are bonded without the intermediate layer, such as the adhesive agent. Therefore, the bonding interface of the pressure sensor is chemically stable. The thermal drift which is caused by the difference between the thermal expansion coefficients of the sensing portion 50 and the stage 60 hardly happen.

Moreover, although the sensing portion 50 and the stage 60 are bonded to each other after the diffusion layer 52, the electrode 57 or the like has been formed, the characteristic of the elements does not change or is not deteriorated by the heat treatment because the temperature of the heat treatment does not need to be high to strongly bond the sensing portion 50 to the stage 60 even if the pressure sensor is a sensor which detects high pressure. When the bonded surfaces are provided with the hydrophilic property, the bonded surfaces are not immersed in the acid solution. Therefore, it is unnecessary to specially form the acid-resisting passivation film on the surface on which the elements are formed, whereby the number of processes does not increase, or the processes are not changed.

Figure 3B:
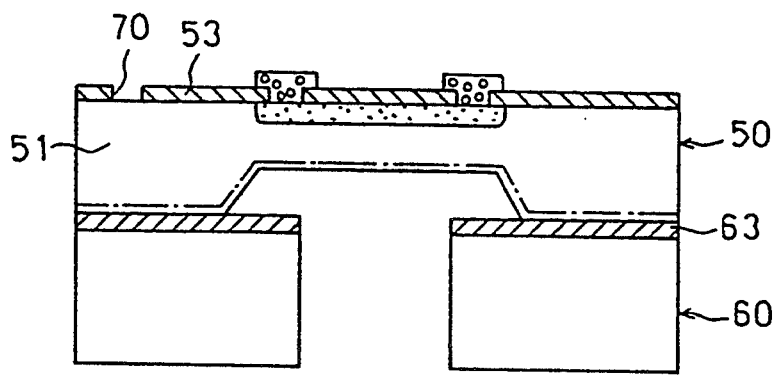
FIG. 3(b) is a cross-sectional view of a semiconductor pressure sensor manufactured by applying the second embodiment.

FIG. 3(b) shows a construction view of the semiconductor pressure sensor manufactured by the method of bonding of the above-mentioned second embodiments. An oxide layer 63 is formed on one surface of the stage 60, the one surface being going to be bonded to the sensing portion 50. A contact hole 70 for contacting with the N-type semiconductor substrate 51 is opened in the passivation film 53 so that the electric voltage can be supplied between the sensing portion 50 and the stage 60 as shown in FIG. 2(c). It is noted that, when wafers, not substrates, are bonded to each other, the contact hole 70 does not need to be formed for an individual sensor. According to the present embodiment shown in FIG. 3(b), in addition to the effect of the embodiment shown in FIG. 3(a), the sensing portion 50 and the stage 60 are uniformly bonded to each other by the electrostatic field which is generated by the electric voltage supplied between the sensing portion 50 and the stage 60 through the contact hole 70, therefore, the sensing portion 50 and the stage 60 are strongly bonded to each other.

FIGS. 4 (a)–4(d) show the method of manufacturing a thin-film SOI(Silicon on Insulator) structure by utilizing the present invention.

Figure 4A:
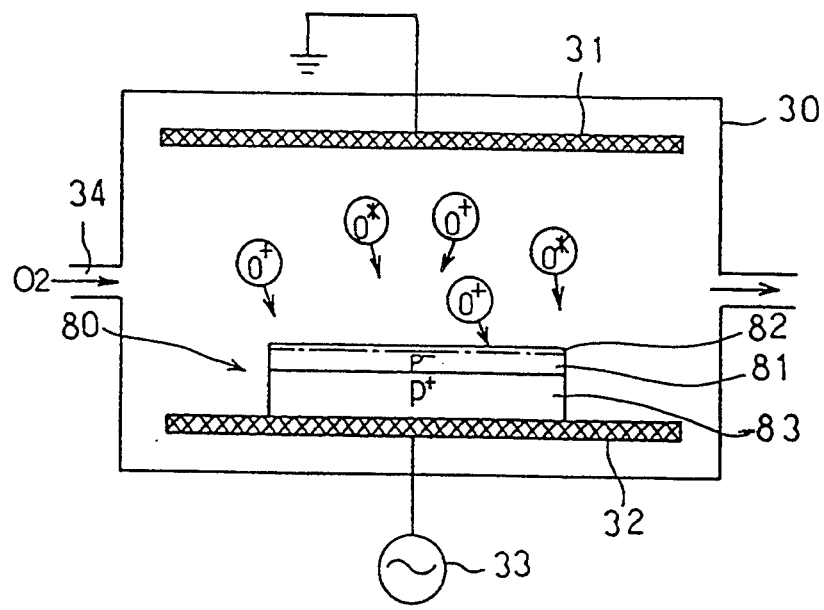
FIGS. 4(a) to 4(d) are schematic diagrams for explaining manufacturing steps of a thin film SOI semiconductor device manufactured by the method of the present invention.

One surface of a P-type high impurity-concentration layer 83 having, for example, an impurity concentration of more than $1 \times 10^{18}/cm^3$ and a thickness of more then 200 μm is mirror-polished. A P-type epitaxial layer 81 having, for example, an impurity concentration of less than $1 \times 10^{17}/cm^3$ and a thickness of 0.1–2 μm is grown on the layer 83. A semiconductor substrate 80 is composed of the layers 83 and 81. As shown in FIG. 4(a), the substrate 80 is put in the vacuum system 30. A plasma oxide layer 82 is formed on the layer 81 by carrying out the oxygen plasma process which is the same as the process explained with reference to FIG. 1(a).

Figure 4B:
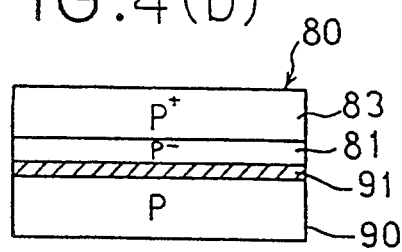

At least one of surfaces of a P-type semiconductor substrate 90 is mirror-polished. An oxide layer 91 is formed on the one surface by thermal oxidation, CVD, sputtering, evaporator or SOG(Spin on Glass) method. As shown in FIG. 4(b), the substrates 80 and 90 are contacted and bonded to each other through the layer 81 and the oxide layer 91 by the process explained with reference to FIGS. 2(b) and 2(c). In this case, because the substrates 80 and 90 have no the Al wiring or the like, the temperature of the heat treatment may be less than 800° C.

Figure 4C:
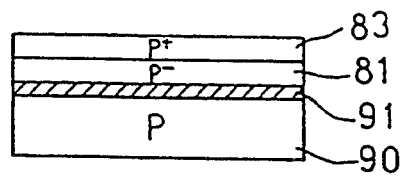

As shown in FIG. 4(c), the layer 83 is ground by a mechanical grinding method until the thickness of the layer 83 is less than 30 μm. The ground surface of the layer 83 is then mirror-polished.

Figure 4D:
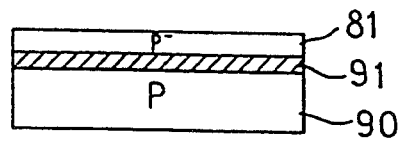

The layer 83 is selectively etched by the mixture of HF, $HNO_3$ and $CH_3COOH$ so that only the layer 81 is left on the oxide layer 91, whereby a thin-film SOI layer is formed as shown in FIG. 4(d). The etching speed ratio of the layer 83 to the layer 81 can be raised until about one hundred. For example, when the thickness of the layer 83 to be etched is 10±5 μm, the dispersion of the etched thickness of the layer 81 is about 100Å. Therefore, when the ratio of the dispersion to the thickness of the layer 81 to be etched is 10%, the dispersion caused by the etching is permitted until the thickness of the layer 81 is about 1000Å. The SOI layer having the uniform thickness is easily formed. Moreover, because the temperature of the heat treatment is so low (that is less than 800° C. in the present embodiment) that the impurity concentration at the bonding interface is not affected by the impurity's diffusion from the layer 81 into the layer 83, the SOI layer is formed with uniform accuracy and with the controllable impurity concentration.

It is noted that an N-type semiconductor substrate may be used in place of the P-type semiconductor substrate, conductivity type of the layer 81 may be different from that of the layer 83.

What is claimed is:

1. A method of bonding semiconductor substrates, which comprises the steps of:
   (a) preparing a plurality of silicon substrates which have surfaces that are mirror-polished;
   (b) providing said mirror-polished surface of at least one of said silicon substrates with a hydrophilic property and with an oxygen concentration which is in a range of 64–73% and said oxygen concentration which gradually becomes lower toward inside said silicon substrate with said hydrophilic property by coupling said at least one of said silicon substrates to a cathode of an electrically biased system and forming an oxide layer on said mirror-polished surface by exposing said mirror-polished surface to an atmosphere including positive oxygen ions;
   (c) adhering water molecules to said mirror-polished surface;
   (d) contacting said silicon substrates with each other through said mirror-polished surface; and
   (e) heating said contacted silicon substrates at a temperature of less than 600° C. to bond strongly said contacted silicon substrates.

2. A method of bonding semiconductor substrates according to claim 1, wherein said oxygen concentration is in a range of 68–70%.

3. A method of bonding semiconductor substrates according to claim 1, wherein a surface roughness Ra of said mirror-polished surface is less than 5 nm.

4. A method of bonding semiconductor substrates according to claim 1, wherein said step (b) is carried out in a situation that said at least one of semiconductor substrates is put in a vacuum system and is cathode-coupled.

5. A method of bonding semiconductor substrates according to claim 1, wherein said step(c) is a step of washing said at least one of semiconductor substrates in pure water.

6. A method of bonding semiconductor substrates according to claim 1, wherein said step (c) is a step of forming a silanol group on said mirror-polished surface.

7. A method of bonding semiconductor substrates according to claim 1, wherein said step (e) is carried out in a situation that an electric voltage is supplied between said semiconductor substrates.

8. A method of bonding semiconductor substrates according to claim 7, said electric voltage is in a range of 100–500 V.

9. A method of bonding semiconductor substrates according to claim 1, wherein said step (e) is a step of heating at less than 450° C.

10. A method of bonding semiconductor substrates according to claim 1, comprising the further step of forming a semiconductor element having a metallic wiring on said at least one of semiconductor substrates before said step (b).

11. A method of bonding semiconductor substrates according to claim 10, wherein said step (e) is a step of heating at a temperature which is less than the melting point of said metallic wiring.

12. A method of bonding semiconductor substrates according to claim 11, wherein one of said semiconductor substrates is a sensing portion of a semiconductor pressure sensor, the other of said semiconductor substrates, is a stage of said semiconductor pressure sensor, and said semiconductor element has a strain gauge.

13. A method of bonding semiconductor substrates according to claim 1, wherein said atmosphere includes oxygen radicals.

14. A method of bonding semiconductor substrates according to claim 1, wherein said oxide layer is formed at normal temperature.

15. A method of manufacturing a semiconductor pressure sensor, which comprises the steps of:

(a) preparing two silicon substrates with mirror-polished surfaces;
(b) forming a strain gauge and a metallic wiring on at least one of said silicon substrates;
(c) providing said mirror-polished surface of at least one of said silicon substrates with a hydrophilic property in such a way that said at least one of said silicon substrates is coupled to a cathode of an electrically biased system and that an oxide layer is formed on said mirror-polished surface by exposing said mirror-polished surface to an atmosphere including positive oxygen ions, wherein an oxygen concentration of said mirror-polished surface is in a range of 64–73% and said oxygen concentration gradually becomes lower toward inside said silicon substrate with said hydrophilic property;
(d) adhering water molecules to said mirror-polished surface;
(e) contacting said two silicon substrates with each other through said mirror-polished surface; and
(f) heating said contacted two silicon substrates at a temperature which is less than the melting point of said metallic wiring to bond strongly said contacted two silicon substrates.

16. A method of manufacturing a semiconductor pressure sensor according to claim 15, wherein said oxygen concentration is in a range of 68–70%.

17. A method of bonding semiconductor substrates according to claim 15, wherein said atmosphere includes oxygen radicals.

18. A method of bonding semiconductor substrates according to claim 15, wherein said oxide layer is formed at normal temperature.

19. A method of bonding semiconductor substrates, which comprises the steps of:
(a) preparing a plurality of silicon substrates, surfaces of said silicon substrates being mirror-polished;
(b) disposing at least one of said silicon substrates in a vacuum environment;
(c) providing an atmosphere including positive oxygen ions on said mirror-polished surface of said one of said silicon substrate to form an oxide layer thereon so that said mirror-polished surface of said one of said silicon substrates is provided with a hydrophilic property; wherein said positive oxygen ions contribute to an oxidation reaction, an oxygen concentration of said mirror-polished surface is in a range of 64–73% and said oxygen concentration gradually becomes lower toward inside said silicon substrate with said hydrophilic property;
(d) adhering water molecules to said mirror-polished surface;
(e) contacting said silicon substrates with each other through said mirror-polished surface; and
(f) heating said contacted silicon substrates at less than 450° C. to bond strongly said contacted silicon substrates.

20. A method of bonding semiconductor substrates according to claim 19, wherein said atmosphere includes oxygen radicals.

21. A method of bonding semiconductor substrates according to claim 19, wherein said oxide layer is formed at normal temperature.

* * * * *